(12) United States Patent
Dubin et al.

(10) Patent No.: US 6,271,591 B1
(45) Date of Patent: Aug. 7, 2001

(54) COPPER-ALUMINUM METALLIZATION

(75) Inventors: Valery Dubin, Cupertino; Chiu Ting, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/312,937

(22) Filed: May 17, 1999

Related U.S. Application Data

(62) Division of application No. 08/786,004, filed on Jan. 21, 1997, now Pat. No. 5,913,147.

(51) Int. Cl.$^7$ ................................................. H01L 23/48
(52) U.S. Cl. ........................ 257/751; 257/762; 257/771
(58) Field of Search ................................... 257/751, 762, 257/765, 771

(56) References Cited

U.S. PATENT DOCUMENTS

| | | | |
|---|---|---|---|
| 4,307,132 | 12/1981 | Chu et al. | 427/90 |
| 4,843,453 | 6/1989 | Hooper et al. | 437/71 |
| 5,130,274 | 7/1992 | Harper et al. | 437/195 |
| 5,243,222 | 9/1993 | Harper et al. | 257/774 |
| 5,308,796 | 5/1994 | Feldman et al. | 437/200 |
| 5,420,069 | 5/1995 | Joshi et al. | 437/187 |
| 5,674,787 | 10/1997 | Zhao et al. | 437/230 |
| 5,789,320 | 8/1998 | Andricacos et al. | 438/678 |
| 5,858,816 | 1/1999 | Sato et al. | 438/125 |

OTHER PUBLICATIONS

P.J. Ding, etc., "Effects of the Addition of Small Amounts of Al to Copper: Corrosion, Resistivity, Adhesion, Morphology, and Diffusion", Journal of Applied Physics, Apr. 1, 1994, vol. 75, No. 7, American Institute of Physics, pp. 3627–3631.

*Primary Examiner*—Roy Potter
(74) *Attorney, Agent, or Firm*—Skjerven Morrill MacPherson LLP; Edward C. Kwok, Esq.

(57) ABSTRACT

A method for fabricating copper-aluminum metallization utilizing the technique of electroless copper deposition is described. The method provides a self-encapsulated copper-aluminum metallization structure.

7 Claims, 4 Drawing Sheets

COPPER-ALUMINUM METALLIZATION

CROSS REFERENCE TO RELATED APPLICATION

This application is a divisional application of U.S. patent application Ser. No. 08/786,004, entitled "The Method For Fabricating Copper-Aluminum Metallization", filed on Jan. 21, 1997 now U.S. Pat. No. 5,913,147 and assigned to Advanced Micro Devices, Inc. which is also the assignee of this application.

BACKGROUND OF THE INVENTION

1. Field of the Invention

The present invention relates to integrated circuit fabrication techniques. In particular, the present invention relates to copper-aluminum metallization.

2. Discussion of the Related Art

In the past, pure aluminum metallization had been used in integrated circuits because of the low cost, good ohmic contact, and high conductivity of aluminum. More recently, aluminum alloys that provide advantages over pure aluminum have also been developed. For example, aluminum is alloyed with copper to provide an aluminum alloy with improved electromigration resistance. However, increasing circuit densities and faster operating speeds of integrated circuit technology require the use of metals having higher conductivities than that of aluminum.

One example of a metal with a conductivity higher than that of aluminum is copper. In the fabrication of an integrated circuit device utilizing pure copper metallization, copper is deposited into vias, trenches, or other recesses to interconnect semiconductor devices or conductive layers formed on a semiconductor substrate. For example, FIG. 1 illustrates a cross-section of a recess 18 in a portion of a prior art copper metallization structure 10. Referring to FIG. 1, in copper metallization structure 10, a copper wire 16 is used to interconnect two or more conductive regions formed in a substrate. Copper wire 16 is formed in a recess 18 defined in a dielectric layer 12. Dielectric layer 12 is typically formed out of silicon dioxide. A diffusion barrier 14 which is formed out of a metal such as tantalum (Ta), Tungsten (W), Chromium (Cr) or a metal composite such as titanium-nitride, titanium-tungsten, tungsten-nitride, or tantalum nitride, is provided as both a diffusion barrier 14 and as an adhesive layer which improves the adhesion of copper wire 16 to dielectric layer 12.

A standard technique such as physical vapor deposition or chemical vapor deposition can be used to form diffusion barrier 14 and copper wire 16 in recess 18. However, physical vapor deposition of copper has poor step-coverage, resulting in void or seam formation. Further, a chemical vapor deposition technique requires careful control of selectivity, processing temperatures, and incurs high capital costs. As a result, electroless copper deposition has been suggested as a superior alternative technique for fabricating copper metallization. This is because electroless deposition techniques incur less capital costs, provides high quality deposited films, is inherently selective and is a conformal deposition process.

One example of electroless copper deposition is described in copending patent application Ser. No. 08/887,264 filed Jan. 16, 1996. Electroless copper deposition, which proceeds at relatively low temperatures, can be used to fill vias, trenches, or other recesses in dielectrics, and to fabricate in-laid copper metallization. Moreover, electroless copper deposition also offers advantages of low cost, high throughput, high quality electroless copper films, and superior recess filling capability.

However, pure copper metallization also has undesirable qualities that present integrated circuit reliability problems. For example, without proper measures, copper is easily oxidized and diffuses into silicon and silicon oxide, causing device failure. Also, pure copper does not adhere well to dielectrics such as silicon dioxide, and presents corrosion problems. As a result, aluminum has been suggested as a doping material to be introduced into the copper metallization to improve oxidation resistance and to act as a diffusion barrier. (See P. J. Ding, W. A. Lanford, S. Hymes, and S. P. Murarka, "Effects of the addition of small amounts of Al to copper: Corrosion, resistivity, adhesion, morphology, and diffusion," Journal of Applied Physics, Volume 75 Number 7).

Fabricating copper-aluminum metallization can be accomplished using a variety of well known techniques. For example, a copper/aluminum bilayer can be deposited by sputtering. Alternatively, a copper-aluminum alloy film can be obtained by annealing an aluminum film provided above or below a copper film. In a conventional process, an annealing step and a wet etch step are required after the copper/aluminum bilayer or the copper-aluminum alloy is formed. Thus, a process for fabricating copper-aluminum metallization based on electroless copper deposition is desired.

Unfortunately, an electroless copper deposition process for fabricating copper-aluminum metallization has proved to be extremely difficult to develop. One difficulty is that co-deposition of aluminum with copper cannot be achieved by electroless plating, because the electrochemical potential of aluminum reduction is highly negative. Another difficulty is that electroless copper deposition on aluminum films cannot be achieved because aluminum films dissolve in a basic electroless copper solution (pH>11).

Accordingly, it would be desirable to provide an improved method for fabricating copper-aluminum metallization using electroless copper deposition.

SUMMARY OF THE INVENTION

The present invention provides an improved method for fabricating copper-aluminum metallization. The present invention also provides improved copper-aluminum metallization structures formed using the fabrication method.

The first step in the method of the present invention is to form a copper-aluminum alloy film in a recess defined in a dielectric such as silicon dioxide. Alternatively, a copper/aluminum bilayer film is deposited on the surfaces of the recess. In either process, a diffusion barrier layer can be formed on the surfaces of the recess before depositing the copper-aluminum alloy film or copper/aluminum bilayer. The diffusion barrier layer includes a metal composite selected from the group of tantalum (Ta), tantalum nitride (TaN), tungsten (W), tungsten nitride (WN), titanium tungsten (TiW), titanium nitride (TiN), tantalum silicon nitride (TaSiN), titanium silicon nitride (TiSiN), or tungsten silicon nitride (WSiN).

One embodiment of the present invention deposits electroless copper into a recess in the substrate. In particular, this embodiment uses an electroless copper deposition to form a copper seed layer on the copper-aluminum alloy film, followed by a copper electroplating step to fill the recess. In another embodiment of the present invention, the recess is filled by depositing electroless copper on a copper-aluminum alloy film.

In the method of the present invention, chemical-mechanical polishing can be applied to the plated copper.

In one embodiment of the present invention low-temperature annealing of in-laid electroless copper deposited on the copper-aluminum alloy film can be used to form a self-encapsulated copper-aluminum metallization structure. In particular, the annealing of the in-laid electroless copper deposited on the copper-aluminum alloy film forms an in-laid copper-aluminum alloy. The annealing results in a metallization structure that is self-encapsulated because (i) a layer of aluminum oxide ($Al_2O_3$) is formed on the exposed surfaces of the in-laid copper-aluminum alloy, and (ii) aluminum oxide and copper-aluminum alloy ($Al_2O_3$+CuAl) is formed on surfaces of the in-laid copper-aluminum alloy that are in contact with the diffusion barrier layer.

Thus, the present invention provides a method for fabricating copper-aluminum metallization using electroless copper deposition. Hence, the method of the present invention represents a significant improvement over prior art fabrication methods.

The self-encapsulated copper-aluminum metallization structures formed in a fabrication method of the present invention provide the following advantages over prior art copper metallization structures: (i) improved adhesion, (ii) a self-aligned diffusion barrier (i.e., aluminum oxide ($Al_2O_3$) on exposed surfaces of the in-laid copper-aluminum alloy, and aluminum oxide and copper-aluminum alloy ($Al_2O_3$+ CuAl) on surfaces of the in-laid copper-aluminum alloy that are in contact with the diffusion barrier layer), (iii) improved electromigration resistance, and (iv) increased corrosion resistance. Thus, the copper-aluminum metallization structures provided by the fabrication method of the present invention represent a significant improvement over prior art copper metallization structures.

The present invention is better understood in consideration of the detailed description below and the accompanying drawings.

DETAILED DESCRIPTION OF THE PREFERRED EMBODIMENTS

The present invention provides a method for fabricating copper-aluminum metallization using electroless copper deposition.

Figure 1:
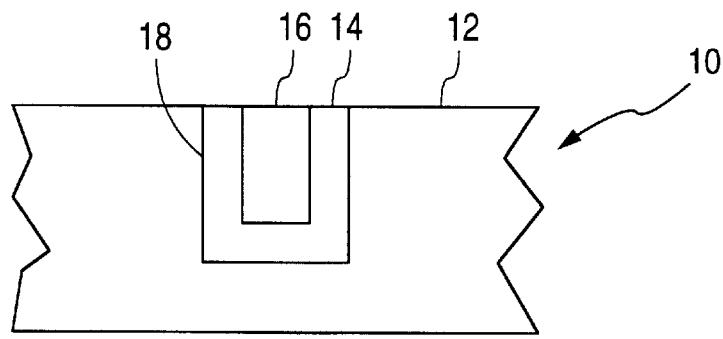
FIG. 1 is a schematic cross-section of a recess 18 showing a portion of a prior art copper metallization structure.
Figure 2A:
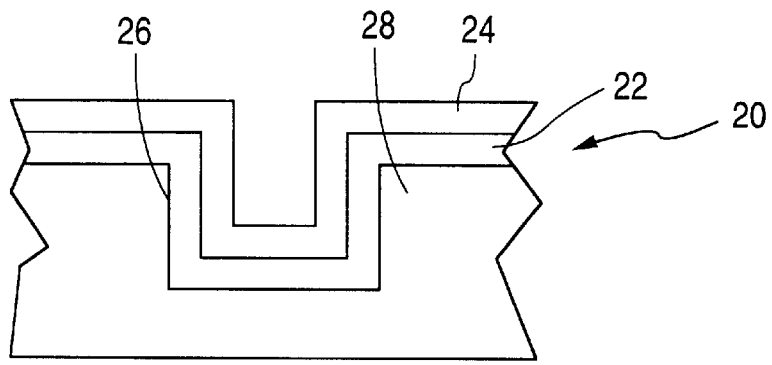
FIG. 2a is a schematic cross-section of a recess 26 showing a portion of a metallization structure after deposition of a copper-aluminum alloy film 24 in accordance with the method of the present invention.

FIG. 2a shows a cross-section of a recess 26 in a portion of a metallization structure 20 after deposition of a copper-aluminum alloy film 24 in accordance with the method of the present invention. To form metallization structure 20, a recess 26 is first defined in a dielectric layer 28, using conventional techniques. Recess 26 can be any trench or via typically used in integrated circuits. Dielectric layer 28 can be, for example, a silicon dioxide layer. Recess 26 can be formed, for example, using any well known photolithographic and etching technique. A standard technique such as physical vapor deposition or chemical vapor deposition can then be used to deposit a diffusion barrier layer 22. Diffusion barrier layer 22 includes a metal composite selected from the group of tantalum (Ta), tantalum nitride (TaN), tungsten (W), tungsten nitride (WN), titanium tungsten (TiW), titanium nitride (TiN), tantalum silicon nitride (TaSiN), titanium silicon nitride (TiSiN), or tungsten silicon nitride (WSiN).

Figure 2B:
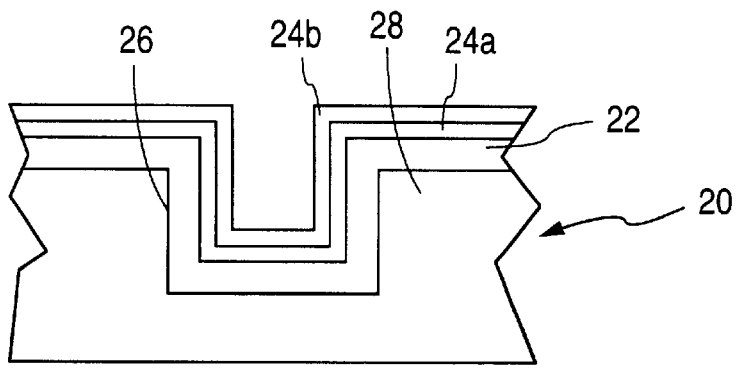

Referring to FIG. 2a, copper-aluminum alloy film 24 is then provided using a standard metallurgical alloying technique on diffusion barrier layer 22 by depositing a 5 nm to 1000 nm copper-aluminum alloy film of 0.5 atomic percent to 96 atomic percent aluminum. Alternatively, as shown in FIG. 2b, film 24 can be a copper/aluminum bilayer film formed on diffusion barrier layer 22 by depositing a 5 nm to 1000 nm thick layer 24a of aluminum on a 5 nm to 1000 nm thick layer 24b of copper, followed by an annealing step at a temperature between 150° C. and 500° C.

Figure 3:
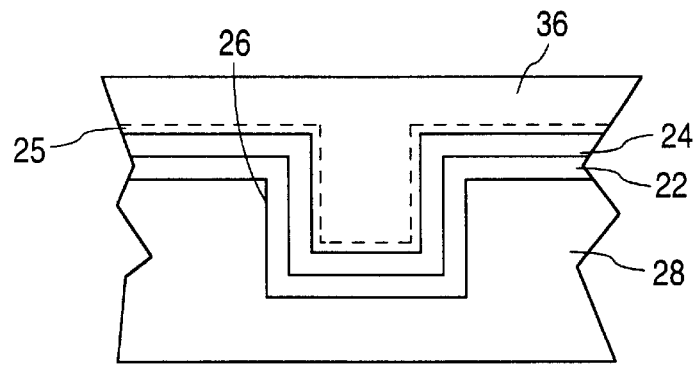
FIG. 3 is a schematic cross-section of recess 26 of FIG. 2a showing a portion of a metallization structure after an electroless copper deposition step.

An electroless copper deposition step is then performed, as shown in FIG. 3. FIG. 3 shows recess 26 of a metallization structure 20 being filled by a plated copper layer 36 using an electroless copper deposition step. In such a process step, to fill recess 26, the electroless copper deposition is achieved by first forming a copper seed layer 25, which is then followed by a copper electroplating step. An electroless copper seed layer repairs and makes continuous the sputtered copper-aluminum film 24, particularly in high aspect-ratio features. Such a seed layer is required in copper electroplating to ensure a continuous conductive path exists for an electrical current to flow in the electroplating step. Alternatively, electroless copper deposition can be used to fill recess 26 completely.

For example, layer 24 is a copper-aluminum layer formed by annealing an aluminum/copper/titanium-nitride multi-layer film in a vacuum at 350° C. for 2 minutes. The multilayer film consists of a 20 nm thick layer of aluminum, a 30 nm thick layer of copper and a 20 nm thick layer of titanium nitride.

Figure 6:
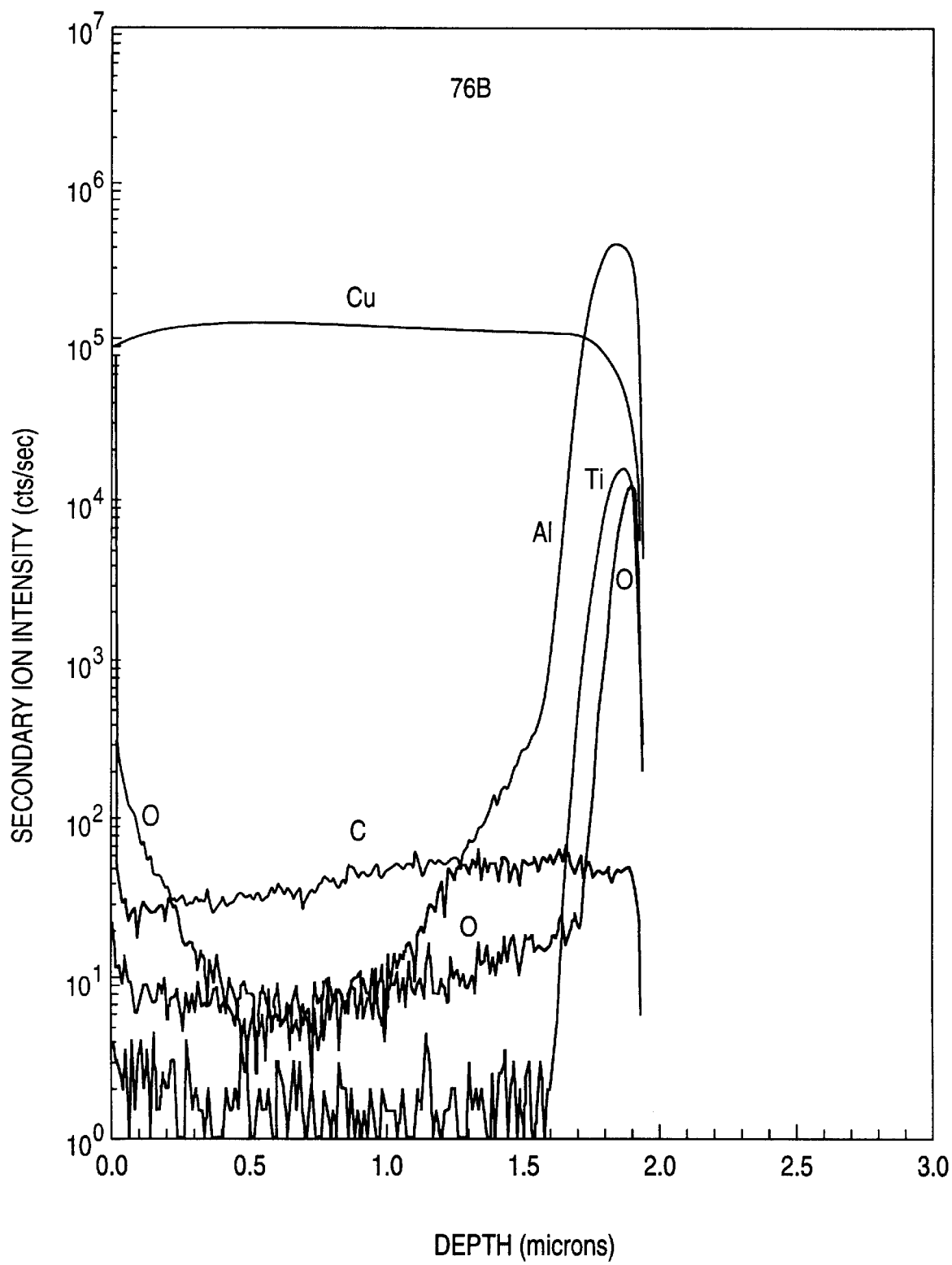
FIG. 6 is a graph showing a secondary ion mass spectroscopy profile of an electroless copper film deposited on a copper-aluminum seed layer over a titanium diffusion barrier layer.

In one embodiment, electroless copper film 36 about 1.5 $\mu$m thick is deposited at 40–85° C., at a pH of 11.5–13.5, on the copper-aluminum layer 24 in a plating solution containing 5–10 g/l $CuSO_4.5H_2O$, 10–30 g/l EDTA$^1$, 15–35 g/l KOH, 0.01–10.0 g/l RE 610, and 5–10 ml/l of 37% solution HCHO (i.e. formaldehyde), or 5–10 g/l HCOCOOH (glyoxylic acid). Resistivity of as-deposited electroless copper films on copper-aluminum layer 24 is measured to be about 1.8 $\mu\Omega$cm. A secondary ion mass spectroscopy (SIMS) profile of as-deposited electroless copper film 36 on copper-aluminum layer 24 with the titanium-nitride diffusion barrier layer 22 is shown in FIG. 6.

In another embodiment, an electroless copper seed layer is deposited at 40–85° C., at a pH of 11.5–13.5, on a 50–1000 nm thick copper-aluminum layer 24 in a plating solution containing 5–10 g/l $CuSO_4.5H_2O$, 10–30 g/l EDTA$^2$, 15–35 g/l KOH, 0.01–10 g/l RE 610 or 0.01–10 g/l polyethylene glycol (molecular weight 200–1000), and 5–10 ml/l HCHO; or 5–10 g/l HCOCOOH. Electroplating is conducted at unipolar or forward/reverse pulse condition with a duty cycle of 50–90%, at a frequency between 10 to 1000 Hz, at a cathodic current density of 10–50 mA/cm$^2$, and a anodic current density of 10–200 mA/cm$^2$. In fact, one embodiment uses a 0.1–100 millisecond envelope of cathodic pulses (duty cycle 50–90%), followed by a 0.110 millisecond envelope of anodic pulses (duty cycle 50–90%).

[1] Ethylene-diamine-tetra-acetic acid
[2] Ethylene-diamine-tetra-acetic acid

Figure 4:
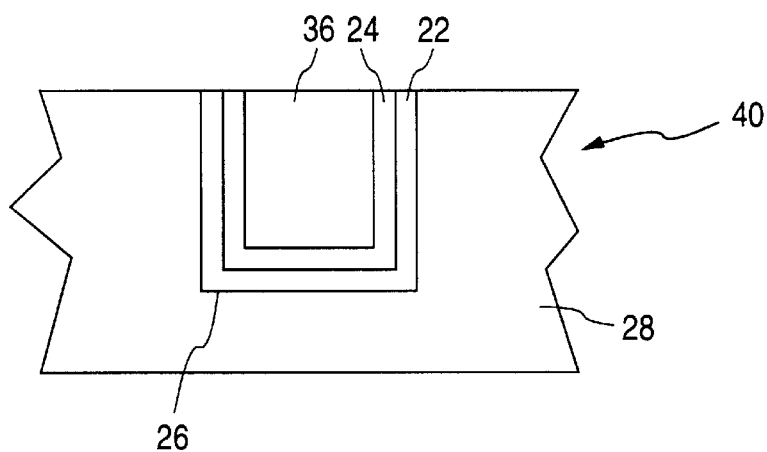
FIG. 4 is a schematic cross-section of recess 26 of FIG. 3 showing a portion of a metallization structure after a chemical-mechanical polishing step.

After deposition of the electroless copper layer 36, chemical-mechanical polishing step is then performed. FIG. 4 shows a cross-section of recess 26 in a portion of a metallization structure 20 after the chemical-mechanical polishing step provides a plated copper layer 36.

Figure 5:
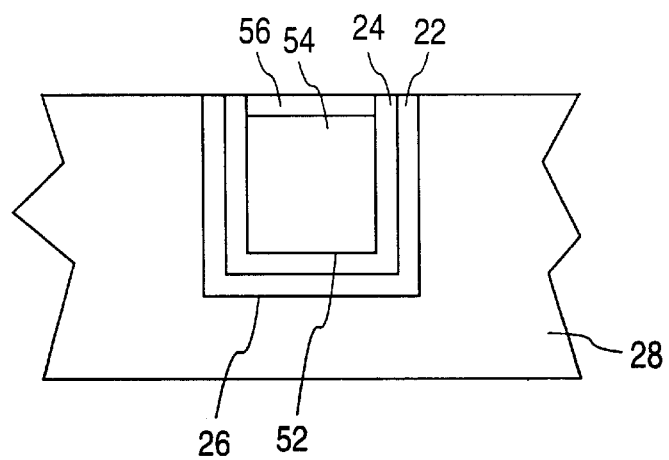
FIG. 5 is a schematic cross-section of recess 26 of FIG. 4 showing a portion of a metallization structure after an annealing step to form an in-laid copper-aluminum alloy layer 54 and thin oxide layer 56.

An annealing step is then performed. FIG. 5 shows a cross-section of recess 26 in a portion of a metallization structure 20 after a low-temperature (150° C.–450° C.) annealing step, under a vacuum or in forming gas, forms an in-laid copper-aluminum alloy layer 54 and thin oxide layers 52 and 56. Oxide layer 52 is formed at the interface between inlaid copper-aluminum alloy 54 and copper aluminum layer 24.

During this annealing step, a copper-aluminum alloy having greater than 50 atomic percent aluminum is formed at the interface between copper-aluminum alloy film 24 and diffusion barrier layer 22, and a copper-aluminum alloy layer having greater than 95 atomic percent copper is formed in the bulk of in-laid copper-aluminum alloy layer 54. At the same time, some elemental aluminum segregates to the surfaces of in-laid copper-aluminum alloy layer 54 that are exposed to oxygen and reacts with the oxygen to form thin oxide layers. More specifically, aluminum oxidation results in the following oxide layers: an aluminum oxide ($Al_2O_3$) 56 on the exposed surfaces of in-laid copper-aluminum alloy layer 54, and an aluminum oxide and copper-aluminum alloy layer ($Al_2O_3$+CuAl) 52 on the surfaces of in-laid copper-aluminum alloy layer 54 adjacent diffusion barrier layer 22. Copper oxide is not formed because the formation energy for aluminum oxide is lower than the formation energy for copper oxide.

Figure 7:
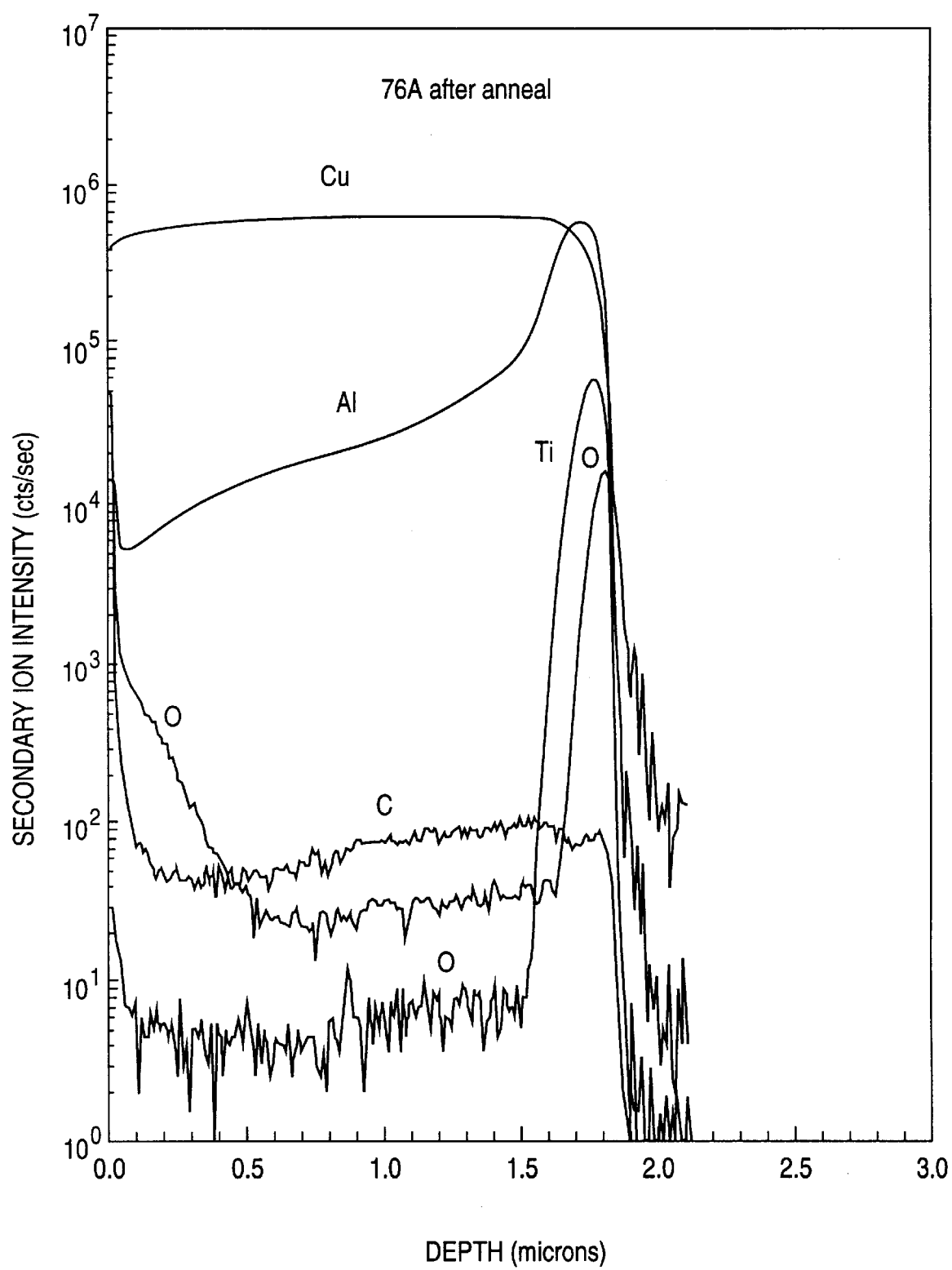
FIG. 7 is a graph showing a secondary ion mass spectroscopy profile of the electroless copper film of FIG. 6 after a further annealing step.

In one instance, annealing at 200° C. for 2 hours in a vacuum is performed. After the annealing step, aluminum content in the electroless copper film is estimated to be about 0.1 atomic percent, having a resistivity of about 1.9 $\mu\Omega$cm. After the aluminum on the copper surface reacts with oxygen and forms an aluminum oxide ($Al_2O_3$), a SIMS profile of electroless copper film on copper-aluminum seed layer 24 with titanium-nitride diffusion barrier layer 22 after the annealing step is shown in FIG. 7.

If the encapsulated copper-aluminum films are then further annealed in air at 300° C. for 1 hour, resistivity increases up to about 2.2 $\mu\Omega$cm. To compare these results of the aluminum-copper films, an undoped electroless copper film of about 1.8 $\mu$m thick was deposited on a copper/titanium bilayer and annealed under the same conditions. The undoped electroless copper film was completely oxidized.

Thus, oxide layers 52 and 56 perform several desirable functions: (i) since pure copper, which does not adhere to pure aluminum or dielectrics such as silicon oxide has excellent adhesion with aluminum oxide, oxide layer 52 acts as an adhesion layer which improves the adhesion of the plated copper to the diffusion barrier layer 22, (ii) oxide layer 52 functions as an additional diffusion barrier; and (iii) oxide layer 56 acts as a passivating layer to increase corrosion resistance.

Thus, metallization structure 20, as shown in FIG. 5, provides a copper-aluminum metallization structure that is self-encapsulated in an aluminum oxide ($Al_2O_3$) layer 56 and aluminum oxide and copper-aluminum alloy ($Al_2O_3$+CuAl) layer 52.

The self-encapsulated copper-aluminum metallization structure provides several advantages over prior art copper metallization structures: (i) improved adhesion the diffusion barrier layer, (ii) self-aligned diffusion barriers in aluminum oxide ($Al_2O_3$) layer 56 and aluminum oxide and copper-aluminum alloy (Al2O3+CuAl) layer 52, (iii) improved electromigration resistance, and (iv) increased corrosion resistance. Thus, the present invention represents a significant improvement over prior art copper metallization structures.

The above description of the present invention is illustrative and not limiting. Other embodiments of this invention will be apparent to one of ordinary skill in the art in light of the above disclosure. Accordingly, the scope of the invention should be determined by the appended claims and their legal equivalents.

We claim:

1. A metallization structure comprising:
    a dielectric layer, having a recess defined therein;
    a diffusion barrier layer formed on surfaces of the recess; and
    a conductive layer filling in the recess, the conductive layer comprising a copper alloy layer, a first thin layer of oxide formed on an exposed surface of the copper alloy layer, and a second thin layer of oxide at the interface between the copper alloy layer and the diffusion barrier layer.

2. A metallization structure as in claim 1, wherein the diffusion barrier layer comprises a metal composite selected from the group of tantalum, tantalum nitride, tungsten, tungsten nitride, titanium tungsten, titanium nitride, tantalum silicon nitride, titanium silicon nitride, or tungsten silicon nitride.

3. A metallization structure as in claim 1, wherein the copper alloy layer comprises aluminum.

4. A metallization structure as in claim 3, wherein the first thin layer of oxide comprises an aluminum oxide ($Al_2O_3$) and the second thin layer of oxide comprises an aluminum oxide and copper-aluminum alloy ($Al_2O_3$+CuAl).

5. A metallization structure as in claim 1, wherein the dielectric layer comprises silicon dioxide.

6. A metallization structure as in claim 1, wherein said copper alloy layer is formed by depositing first a CuAl bilayer followed by an annealing step.

7. A metallization structure as in claim 6, wherein said annealing step of the CuAl bilayer is carried out at a temperature between 150° C. to 500° C.

* * * * *